United States Patent
Matsubara et al.

(10) Patent No.: US 7,012,836 B2
(45) Date of Patent: Mar. 14, 2006

(54) NONVOLATILE MEMORY AND METHOD OF RESTORING OF FAILURE MEMORY CELL

(75) Inventors: Ken Matsubara, Higashimurayama (JP); Takayuki Tamura, Higashiyamato (JP); Tomoyuki Fujisawa, Takarazuka (JP)

(73) Assignee: Renesas Technology Corp., Tokyo (JP)

( * ) Notice: Subject to any disclaimer, the term of this patent is extended or adjusted under 35 U.S.C. 154(b) by 175 days.

(21) Appl. No.: 10/767,627

(22) Filed: Jan. 30, 2004

(65) Prior Publication Data
US 2004/0264245 A1    Dec. 30, 2004

(30) Foreign Application Priority Data
Feb. 21, 2003   (JP)   ............................. 2003-043992

(51) Int. Cl.
*G11C 16/04*   (2006.01)

(52) U.S. Cl. ........................... 365/185.18; 365/185.24; 365/185.29; 365/185.33

(58) Field of Classification Search .......... 365/185.18, 365/185.24, 185.29, 185.33
See application file for complete search history.

(56) References Cited

U.S. PATENT DOCUMENTS

| | | | |
|---|---|---|---|
| 5,969,993 A | * | 10/1999 | Takeshima ............. 365/185.29 |
| 6,567,315 B1 | | 5/2003 | Takase et al. .......... 365/185.28 |
| 2003/0133348 A1 | * | 7/2003 | Wong ........................ 365/222 |

FOREIGN PATENT DOCUMENTS

JP    2002-197876    12/2002

* cited by examiner

*Primary Examiner*—Anh Phung
*Assistant Examiner*—N Nguyen
(74) *Attorney, Agent, or Firm*—Miles & Stockbridge P.C.

(57) ABSTRACT

An electrically writable/erasable nonvolatile semiconductor memory such as an AND-type or NOR-type flash memory having an array structure, in which numerous memory cells are connected in parallel between common bit lines and source lines, is capable of readily detecting a memory cell in depletion failure which occurs in the event of a power supply cutoff during a memory cell threshold voltage shift-down operation by the writing or erasing operation. In operation, at the entry of a certain command or at the time of power-on, all word lines are unselected and bit line selecting switches are turned on to find the presence of a memory cell having a current flow due to depletion failure with sense amplifiers connected to the bit lines. On finding the presence of a failing cell, a voltage of selection level (VSS or negative voltage) is applied to each word line in turn, with remaining word lines being pulled to an unselection voltage level (negative voltage or VSS).

10 Claims, 16 Drawing Sheets

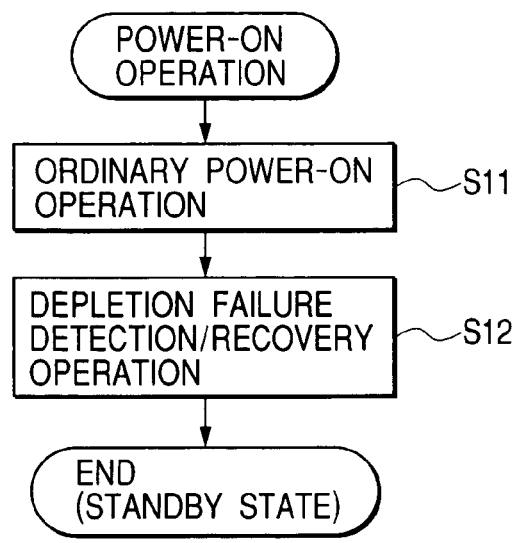
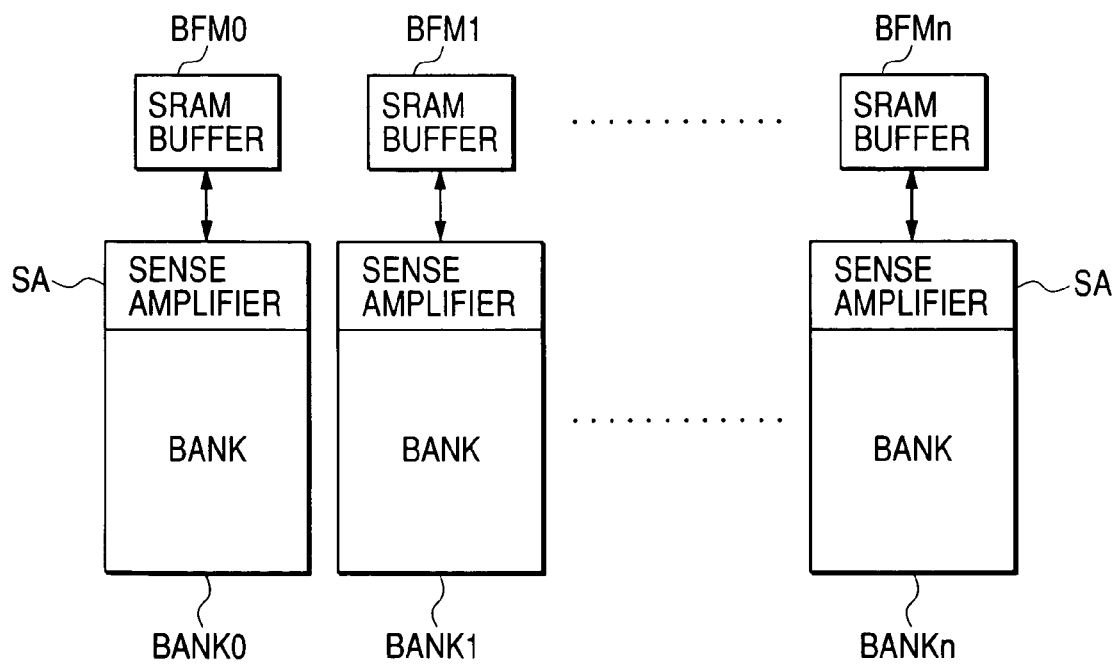

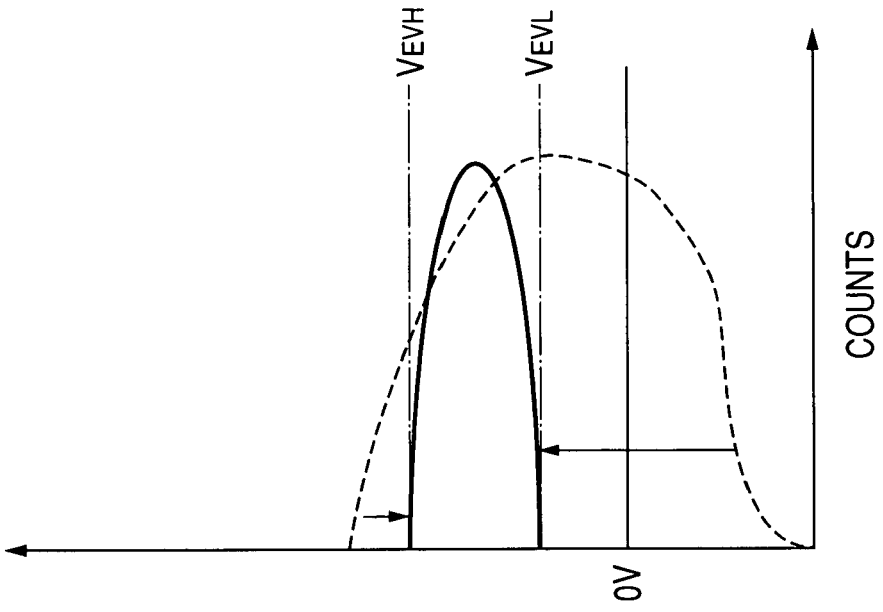
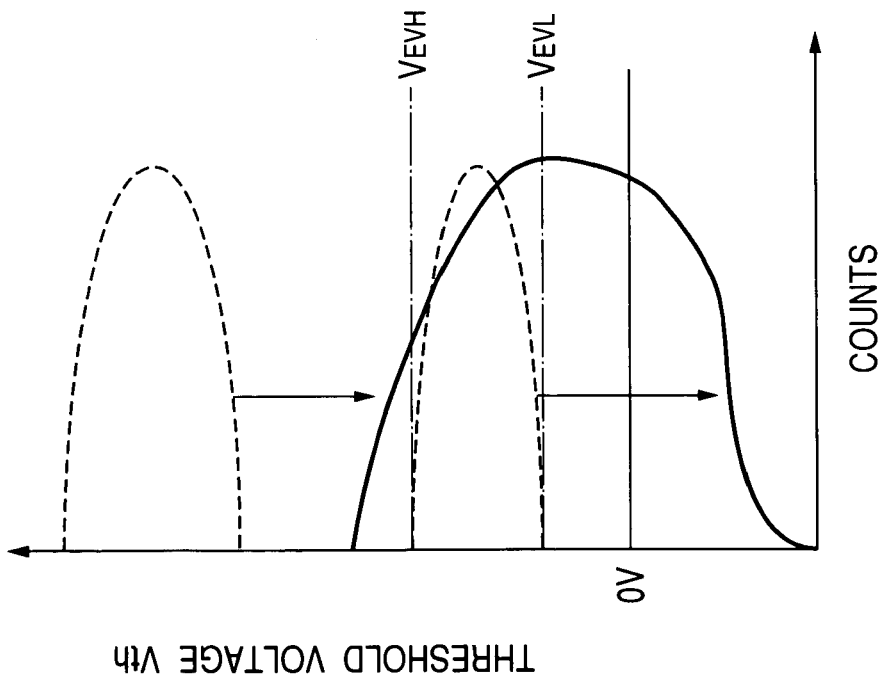

NONVOLATILE MEMORY AND METHOD OF RESTORING OF FAILURE MEMORY CELL

BACKGROUND OF THE INVENTION

The present invention relates to a technique for restoring the normality of an electrically writable/erasable nonvolatile semiconductor memory, particularly a flash memory which is adapted to erase a certain number of bits of data at once, at the emergence of a memory cell having its threshold voltage falling below the prescribed level due to a cutoff of power supply or the like during the data writing or erasing operation.

A flash memory uses nonvolatile memory cells each formed of a MOSFET of the dual gate structure having a control gate and a floating gate. A memory cell stores a bit of data in terms of the shift of threshold voltage of MOSFET in response to the change of stored charges of the floating gate as shown in FIG. 16A. The state of high threshold voltage of MOSFET corresponds to data "1" and the state of low threshold voltage corresponds to data "0" in FIG. 16A.

Memory cells of this flash memory have their threshold voltage shifted by the data writing or erasing operation. Due to the disparity of memory cell characteristics, the threshold voltage shifts differently among memory cells, and there can emerge memory cells having their threshold voltage falling below 0 V (will be called "depletion state") as shown by hatching in FIG. 16B. Usually, these memory cells in depletion state have their threshold voltage restored into the normal range based on the "write-up" or "write-back" operation.

SUMMARY OF THE INVENTION

A flash memory used in a memory card or the like can possibly have its power supply cut off during the writing or erasing operation on such occasions that the external power supply is interrupted or the card user pulls out the card from the card slot. In this case, partial memory cells in the memory cell array can possibly be left in the depletion state due to a power supply cutoff. In the case of a flash memory of the so-called AND type or NOR type, in which memory cells MC are connected in parallel between a bit line BL and a source line SL as shown in FIGS. 18A and 18B, an unselected memory cell in depletion state conducts a current (will be called "depletion failure"), giving rise to the failure of normal data read-out from a selected memory cell.

FIGS. 18A and 18B show the current conduction states of a selected cell MC0 and unselected cells MC1 to MCn. FIG. 18A is the case of all the unselected cells MC1 to MCn without depletion failure, and FIG. 18B is the case of the unselected cell MC2 in depletion failure. Normally, a current I does not flow from the bit line BL to the source line SL through the selected cell MC0 having a high threshold voltage as shown in FIG. 18A, whereas the cell MC2 in depletion failure among the unselected cells MC1 to MCn conducts a current I from the bit line BL to the source line SL, resulting in an erroneous data read-out as shown in FIG. 18B.

If a memory cell in depletion failure is included in the system area for storing file location data or format data which is important for the system, the memory system can possibly malfunction. A conceivable counter measure is to find a memory cell in depletion failure thereby to recover the normality of flash memory. However, in the event of a power supply cutoff during the erasing operation or the like, the memory address for erasure becomes unknown, and finding a memory cell in depletion failure is not easy.

There is a technique for restoring a memory cell in depletion failure to the normal erasure state as described in Japanese Patent Unexamined Publication No. 2002-197876 for example. However, this technique is intended for a flash memory, with memory cells having source lines separated for individual word lines, and therefore it cannot be applied directly to a flash memory of the AND type or NOR type in which numerous memory cells are connected in parallel between common bit lines and source lines, instead of having source lines separated for individual word lines.

A conceivable scheme to facilitate the detection of a memory cell in depletion failure is to operate the flash memory so that the word lines of memory cells are separated for individual word lines thereby to meet the case of the abovementioned patent publication. However, it necessitates additional switch elements for connecting and disconnecting the word lines and a circuit for producing switching signals, giving rise to the emergence of another problem of increased circuit scale.

An object of the present invention is to provide an electrically writable/erasable nonvolatile semiconductor memory such as an AND-type or NOR-type flash memory having the array structure in which numerous memory cells are connected in parallel between common bit lines and source lines, the memory being capable of readily detecting a memory cell in depletion failure occurring in the event of a power supply cutoff during the memory cell threshold voltage shift-down operation by the writing or erasing operation for example.

Another object of the present invention is to provide an electrically writable/erasable nonvolatile semiconductor memory such as an AND-type or NOR-type flash memory having the array structure in which numerous memory cells are connected in parallel between common bit lines and source lines, the memory being capable of detecting a memory cell in depletion failure and recovering the memory cell from the depletion state swiftly.

Still another object of the present invention is to provide a nonvolatile semiconductor memory which is capable of detecting and recovering a memory cell in depletion failure without the imposition of significant increase in circuit scale.

These and other objects and novel features of the present invention will become apparent from the following description and attached drawings.

Among the affairs of the present invention disclosed in this specification, representatives are briefed as follows.

The invention set forth in claim 1 resides in a nonvolatile semiconductor memory having numerous memory cells connected in parallel between common bit lines and source lines, the memory operating to turn on bit line select switches, with all word lines being unselected, in response to the entry of a certain command or at the turn-on of power, thereby finding the presence of a memory cell having a current conduction, i.e., a memory cell in depletion state, with sense amplifiers which are connected to the bit lines. On finding the presence of a memory cell in depletion state, a negative voltage is applied to each word line in turn among the word lines of memory cells which are connected to the common source lines and bit lines, with remaining word lines being kept unselected.

Specifically, when the bit line select switches are turned on, with all word lines being unselected, a memory cell in depletion state connected to a bit line has a current flow to the source line, causing the bit line voltage to fall, in contrast to the absence of a failing cell in which case the bit line voltage does not fall. Accordingly, the presence or absence of a memory cell in depletion state can be determined based on the detection of the bit line voltage with the sense amplifier connected to each bit line.

On finding the presence of a memory cell in depletion state, when a negative voltage is applied to each word line in turn, with remaining word lines being kept unselected, the current flow ceases when the negative voltage is applied to the word line in connection with the memory cell in depletion state. Accordingly, based on the detection of the bit line voltage with the sense amplifier connected to the bit line, it is possible to find as to which memory cell, among the memory cells connected to the common source line and bit line, is depletion state.

Preferably, on pinpointing a memory cell in depletion state, the bit lines are pulled to the high level or low level depending on the preceding read-out data which is held immediately in the sense amplifiers, and the writing voltage is applied to the word line of the failing cell thereby to write-back the memory cell so as to change the threshold voltage higher. Consequently, when a memory cell in depletion state is detected, it can be recovered from the depletion state swiftly by having its threshold voltage raised.

BRIEF DESCRIPTION OF THE DRAWINGS

FIG. 12 is a flowchart showing the power turn-on operation of a flash memory based on a first variant embodiment;

FIG. 13 is a block diagram showing a flash memory of a second variant embodiment;

FIGS. 17A and 17B are histograms of threshold voltage of memory cells of the flash memories of the embodiments, showing the case at a power supply cutoff during the data erasing operation and the case after the recovery of depletion failure of the memory cell array, respectively.

DESCRIPTION OF THE PREFERRED EMBODIMENTS

Embodiments of this invention will be explained with reference to the drawings.

Figure 1:
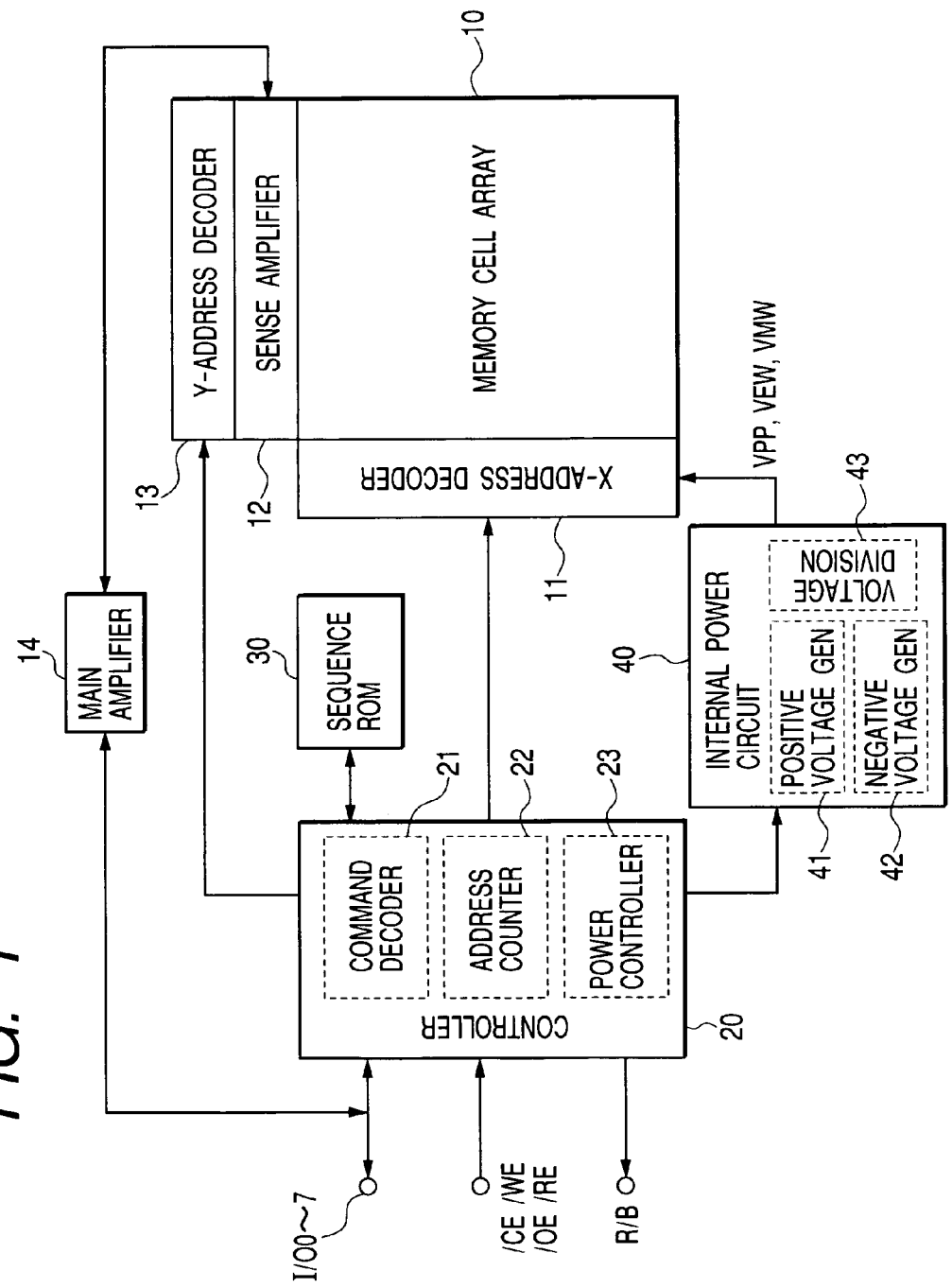
FIG. 1 is a block diagram showing in brief the arrangement of a flash memory as an example of nonvolatile semiconductor memory to which the present invention is applied effectively.

FIG. 1 shows by block diagram a flash memory as a nonvolatile semiconductor memory to which the present invention is applied suitably.

In FIG. 1, the flash memory includes a memory cell array 10 formed of numerous nonvolatile memory elements (memory cells) in matrix arrangement and an X-address decoder 11 which decodes an address (X address) signal to select a corresponding word line WL of the memory cell array 10. The X-address decoder 11 includes a word driver circuit which pulls the selected word line WL to the selection level. Each memory cell of the memory cell array 10 is a MOSFET having a floating gate and a control gate, and it stores a bit of data in terms of the setting of a high or low threshold voltage based on the quantity of charges injected to the floating gate.

A state of the lowest threshold voltage will be called "erased state" in the following explanation. Namely, the operation of shifting down the threshold voltage is called erasing, in contrast to the operation of shifting up the threshold voltage which is called writing or write-back.

Indicated by 12 is a sense amplifier circuit, which is connected to the bit lines of the memory cell array 10 to hold data to be written and amplify and latch data signals read out to the bit lines, 13 is a Y-address decoder which selects a certain bits of, i.e., a byte or a word of, write-in data or read-out data from among plural memory cells connected to one word line, and 14 is a main amplifier circuit which holds write-in data which is put in to the memory from the outside and amplifies read-out data which has been amplified by the sense amplifier circuit 12 and is released to the outside of the memory.

Indicated by 20 is a control circuit which includes a command decoder 21 for decoding a command code which is put in to the memory from the outside through input/output terminals I/O0–I/O7, an address counter 22 which produces an x-address and y-address, and a power control circuit 23 which controls the generation of internal power voltage. Indicated by 30 is a ROM which stores a control program for the control circuit 20, and 40 is an internal power circuit which produces high voltages (including a negative voltage) used for data writing and erasure and depletion state detection and a reference voltage for high voltage generation.

The internal power circuit 40 includes a positive voltage circuit 41 which is made up of a charge pump, voltage regulator and reference voltage circuit to produce a high positive voltage VPP, e.g., +15 V, to be applied to the word lines for data writing and a verifying voltage VWV, a negative voltage circuit 42 which produces a high negative voltage VEW, e.g., −18 V, to be applied to the word lines for data erasure, and a voltage division circuit 43 which is made up of voltage dividing resistors and amplifiers to divide the voltages produced by the positive voltage circuit 41 and negative voltage circuit 42. The voltage division circuit 43 produces a negative voltage WMW, e.g., −6 V, to be used for depletion state detection from the negative voltage VEW produced for data erasure by the negative voltage circuit 42. The voltages produced by the internal power circuit 40 are supplied to the x-address decoder 11 and applied to the word lines.

The input/output terminals I/O0–I/O7 are used for the entry of write-in data and address and the release of read-out data, besides the entry of command codes mentioned previously. External write-in data placed on the input/output terminals I/O0–I/O7 is conducted to the memory cell array 10 by way of the main amplifier circuit 14 and sense amplifier circuit 12, while an address is held in the control circuit 20, in which it is converted by the address counter 22 depending on the operation mode and data length and delivered to the address decoders 11 and 13.

This flash memory has control terminals for receiving external control signals such as the chip select signal /CE, write control signal /WE, output control signal /OE, and read control signal /RE. These control signals are given to the control circuit 20 and used to control the internal operation of the flash memory. The signals having their names headed by symbol "/" are low-active signals, although this signal form is not compulsory. The control circuit 20 releases to the outside of flash memory a Ready/Busy signal R/B indicative of as to whether or not the memory is ready to receive an external command.

Figure 2:
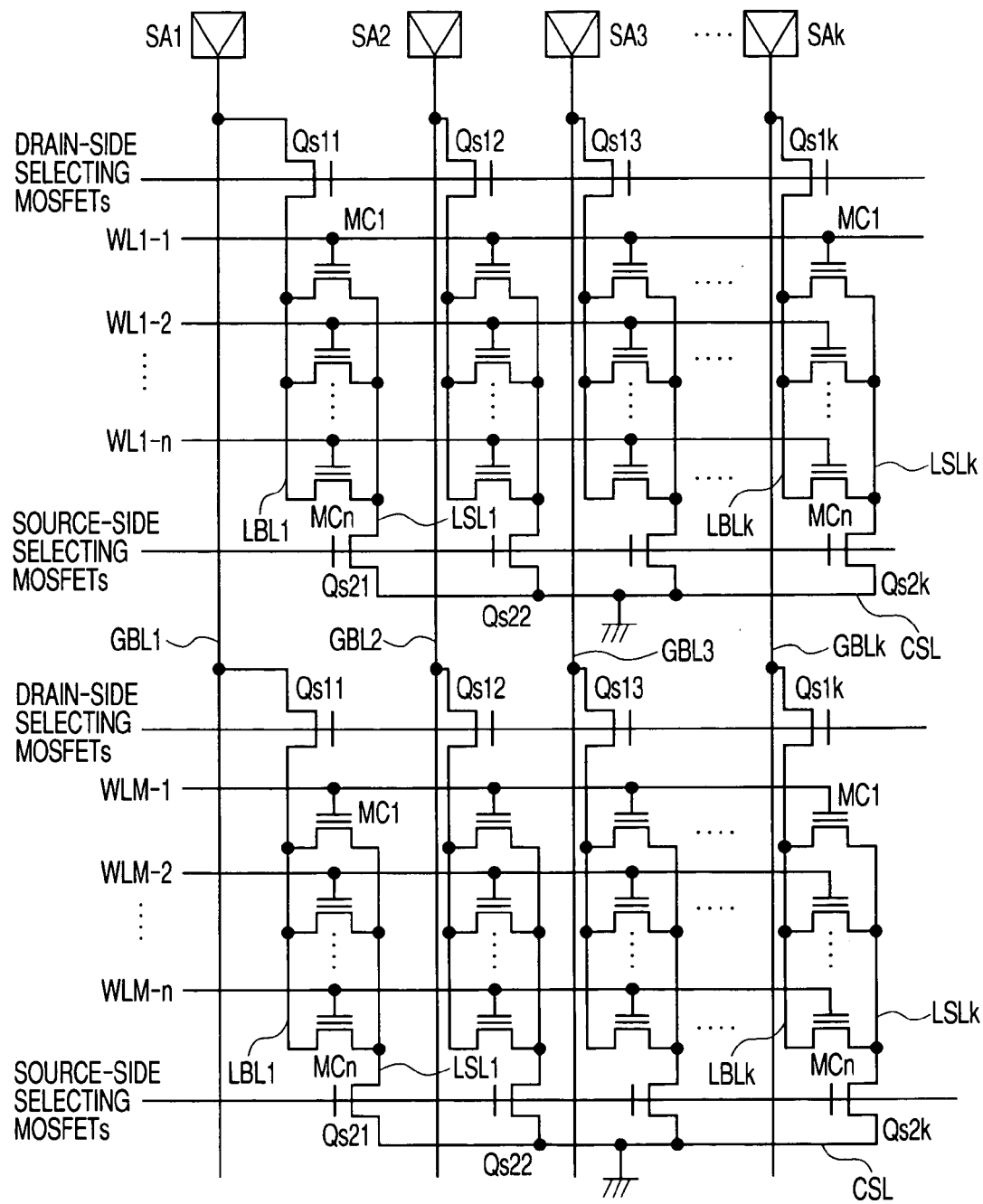
FIG. 2 is a schematic circuit diagram showing the configuration of a memory cell array of the AND-type flash memory based on a first embodiment of this invention.

As shown in FIG. 2, this flash memory has a so-called AND-type memory cell array, in which memory cells MC1–MCn of n in number (n is a positive integer) are connected in parallel between local bit lines LBL1 to LBLk and local source lines LSL1 to LSLk to form columns of k in number aligning along the word lines. The total number n×k of memory cells in the columns is called here "string".

This memory cell array consists of plural strings. Memory cells in the columns align laterally to form rows, and rows of memory cells are connected to the respective common word lines WL1-1 through WL1-$n$. A row of memory cells connected to a common word line is called here "sector". The flash memory of this embodiment is designed to write and erase sector by sector.

The local bit lines LBL1 to LBLk are adapted to connect to global bit lines GBL1 to GBLk through selecting MOSFETs Qs11 to Qs1$k$, respectively. The local bit lines of other strings are also adapted to connect to the global bit lines GBL1 to GBLk through selecting MOSFETs Qs11 to Qs1$k$, respectively.

The local source lines LSL1 to LSLk of a string are connected to a common source line CSL through source selecting MOSFETs Qs21 to Qs2$k$, respectively. The selecting MOSFETs Qs11 to Qs1$k$ and Qs21 to Qs2$k$ are turned on or off selectively in response to a signal which is produced at a certain timing by the X-address decoder 11.

In the writing or erasing operation, one of n word lines of a string is selected, and a high positive voltage, e.g., 15 V, for writing or a high negative voltage, e.g., −18 V, for erasing is applied to the selected word line. Local bit lines relevant to memory cells that are to have the threshold voltage shifted up at writing have application of 0 V, and other local bit lines have application of 5 V. Consequently, memory cells connected to each word line have their threshold voltage shifted up selectively. As to which of 0 V or 5 V being applied to the local bit lines at writing is determined by write-in data which is held in the sense amplifiers SA1 to SAk connected to the global bit lines GBL1 to GBLk.

Next, the operation of detecting a memory cell in depletion failure of the flash memory of this embodiment will be explained with reference to the flowchart of FIG. 3. The operation starts when the flash memory receives a certain external command, which causes the control circuit 20 to load and run a certain program which is stored in advance in the program ROM 30.

The operation of detecting a memory cell in depletion failure includes a first stage of surveying each string for finding the emergence of depletion failure (will be called string survey) and a second stage of pinpointing the failing cell within the string on finding the emergence of depletion failure (will be called word line survey).

Initially, step S1 surveys the first string for finding the emergence of depletion failure. In the absence of depletion failure, step S2 checks whether the string is the last one. Unless it is the last string, the sequence proceeds to step S3, which increments the string number, and the sequence returns to step S1. If step S1 finds the emergence of depletion failure in the selected string, the sequence branches to step S4 to commence the word line survey for pinpointing a failing cell.

In the word line survey, step S4 surveys the first word line to find the emergence of depletion failure. In the absence of depletion failure, step S5 checks whether the word line is the last one. Unless it is the last word line, the sequence proceeds to step S6, which advances the word line, and the sequence returns to step S4. If step S4 detects a failing cell connected to the selected word line, the sequence branches to step S7 to carry out the recovery operation for the memory cell, and the sequence returns to step S2.

Next, the principle of detection of a memory cell in depletion failure of the flash memory of this embodiment will be explained with reference to the circuit diagrams of FIG. 4 through FIG. 7.

Figure 4:
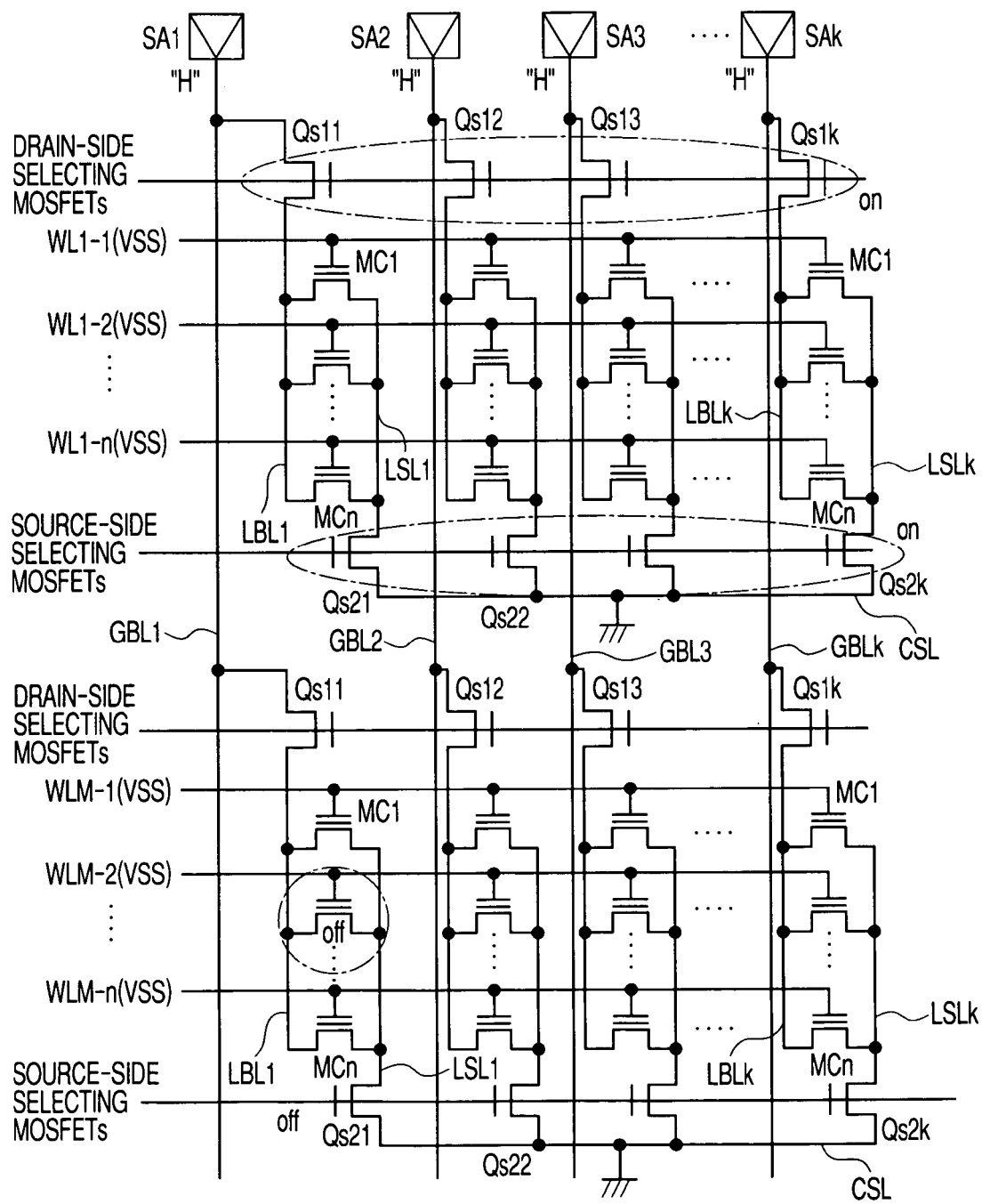
FIG. 4 is a schematic circuit diagram used to explain a first stage of depletion failure detection (at the selection of a string without depletion failure) for the flash memory of this embodiment.

At the first stage of operation for surveying each string for finding the emergence of depletion failure, all word lines WL1 to WLN of the selected string are pulled to the unselection level VSS (0 V) and the drain-side and source-side selecting MOSFETs Qs11 to Qs1$k$ and Qs21 to Qs2$k$ are turned on so that the local bit lines LBL1 to LBLk of the selected string are precharged to the high level (e.g., 3.3 V) by the sense amplifiers SA1 to SAk by way of the global bit lines GBL1 to GBLk, as shown in FIG. 4.

The threshold voltage of memory cells without depletion failure is not brought to an on-state which is higher than the unselection level of word line, and therefore if there is no failing cell within the selected string, the voltage of any bit line LBL1 to LBLk does not fall as shown in FIG. 4. Consequently, the sense amplifiers SA1 to SAk all detect the high level (data "1").

Figure 5:
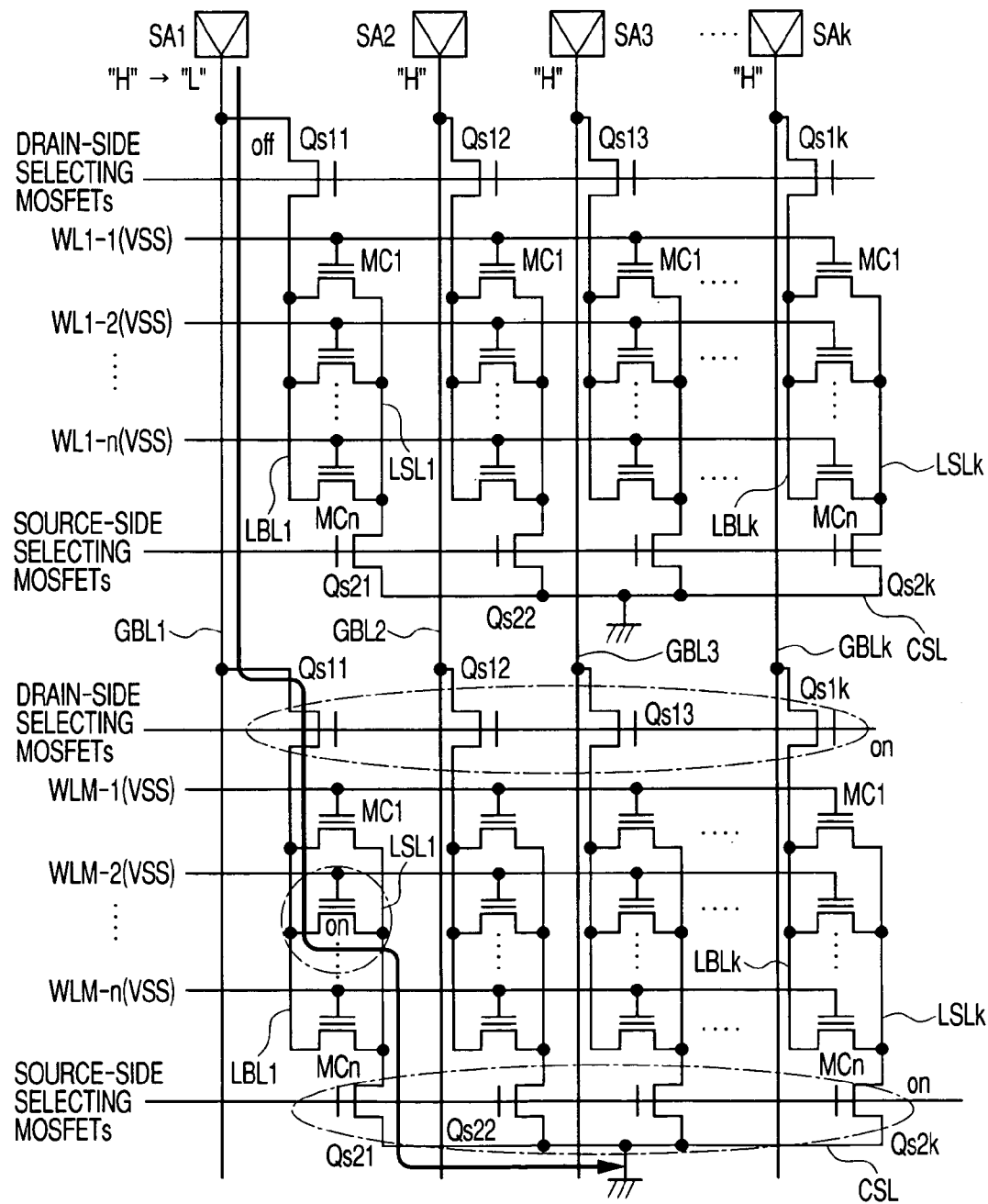
FIG. 5 is a schematic circuit diagram used to explain the first stage of depletion failure detection (at the selection of a string with depletion failure) for the flash memory of this embodiment.

On the other hand, the threshold voltage of a memory cell in depletion failure is brought to an on-state which is lower than the unselection level of word line, and therefore if there is a failing cell within the selected string, a current flows from the bit line to the source line through the failing cell, causing the bit line voltage to fall, as shown in FIG. 5. Consequently, the sense amplifier of that bit line detects the low level (data "0"). FIG. 5 shows the depletion failure of memory cell MC2 which is connected to the local bit line LBL1 and the resulting low-level detection by the sense amplifier SA1.

Figure 6:
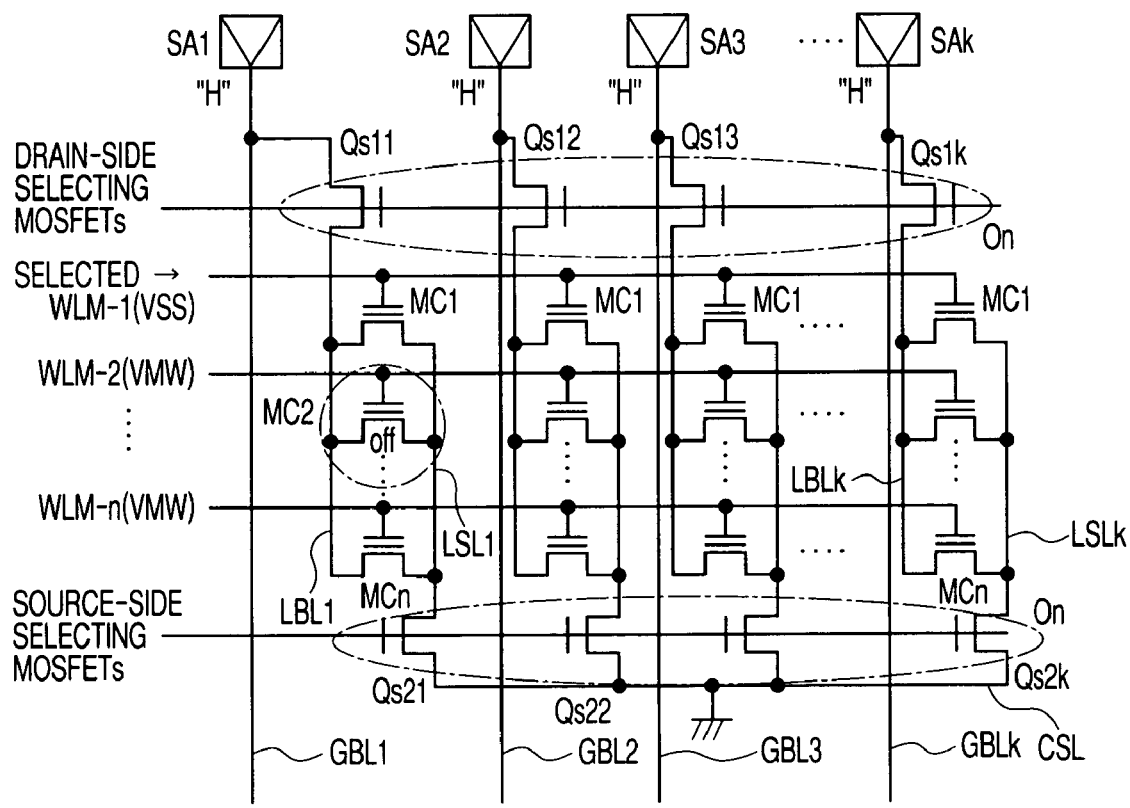
FIG. 6 is a schematic circuit diagram used to explain a second stage of depletion failure detection (at the selection of a word line without depletion failure) for the flash memory of this embodiment.
Figure 7:
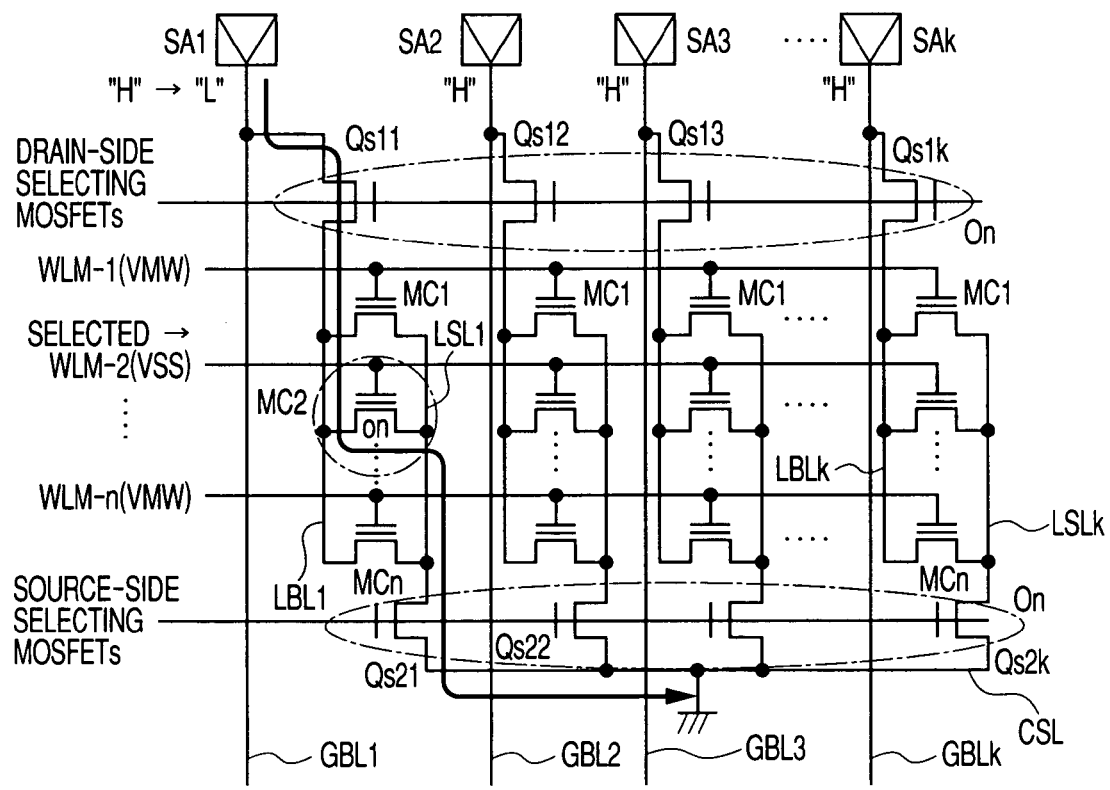
FIG. 7 is a schematic circuit diagram used to explain the second stage of depletion failure detection (at the selection of a word line with depletion failure) for the flash memory of this embodiment.

Subsequently, at the second stage of operation for pinpointing a failing cell, all drain-side and source-side selecting MOSFETs Qs11 to Qs1$k$ and Qs21 to Qs2$k$ in the selected string are turned on and each word line WLM-1 through WLM-n is pulled to the selection level in turn, with remaining word lines being left at the unselection level, so that the local bit lines LBL1 to LBLk of the selected string are precharged to the high level (e.g., 3.3 V) by the sense amplifiers SA1 to SAk by way of the global bit lines GBL1-GBLk, as shown in FIG. 6 and FIG. 7.

The word line selection level for depletion failure detection based on this embodiment is not the selection level of the usual reading operation, but it is set equal to the unselection level VSS (0 V) of the usual reading operation. Unselected word lines do not have their level VMW pulled to the unselection level of the usual reading operation, but it is pulled to a negative voltage, e.g., −6 V, which is lower than the threshold voltage of a failing cell.

Although memory cells without depletion failure have their threshold voltage always brought to the off-level which is lower than the word line selection level VSS (0 V) and unselection level VMW (−6 V), the threshold voltage of a failing cell is lower than the word line selection level VSS (0 V) and higher than the unselection level VMW (−6 V), and therefore the memory cell is brought to the on-state or off-state depending on the word line level.

On this account, unless a memory cell in depletion failure is connected to the word line having application of the selection level VSS (0 V) when each word line WL1 to WLN is pulled to the selection level in turn, a failing cell becomes the off-state and the voltage of any local bit line LBL1 to LBLk does not fall, as shown in FIG. 6. Consequently, the sense amplifiers SA1 to SAk all detect the high level (data "1").

Otherwise, if a memory cell in depletion failure is connected to the word line having application of the selection level VSS (0 V), the word line selection level VSS (0 V) becomes higher than the threshold voltage of the failing cell, causing the memory cell, which has been off at the unselection level VMW (−6 V), turns to the on-state. Consequently, a current flows from the bit line to the source line through the memory cell of on-state, causing the bit line voltage to fall, and the sense amplifier of that bit line detects the low level (data "0"), as shown in FIG. 7.

FIG. 7 shows the depletion failure of memory cell MC2 which is connected to the local bit line LBL1 and the resulting low-level detection by the sense amplifier SA1. Accordingly, on detecting the low level (data "0") by any one sense amplifier among SA1 to SAk, it can be determined that a memory cell in depletion failure exists on the immediate word line (within the sector).

Figure 8:
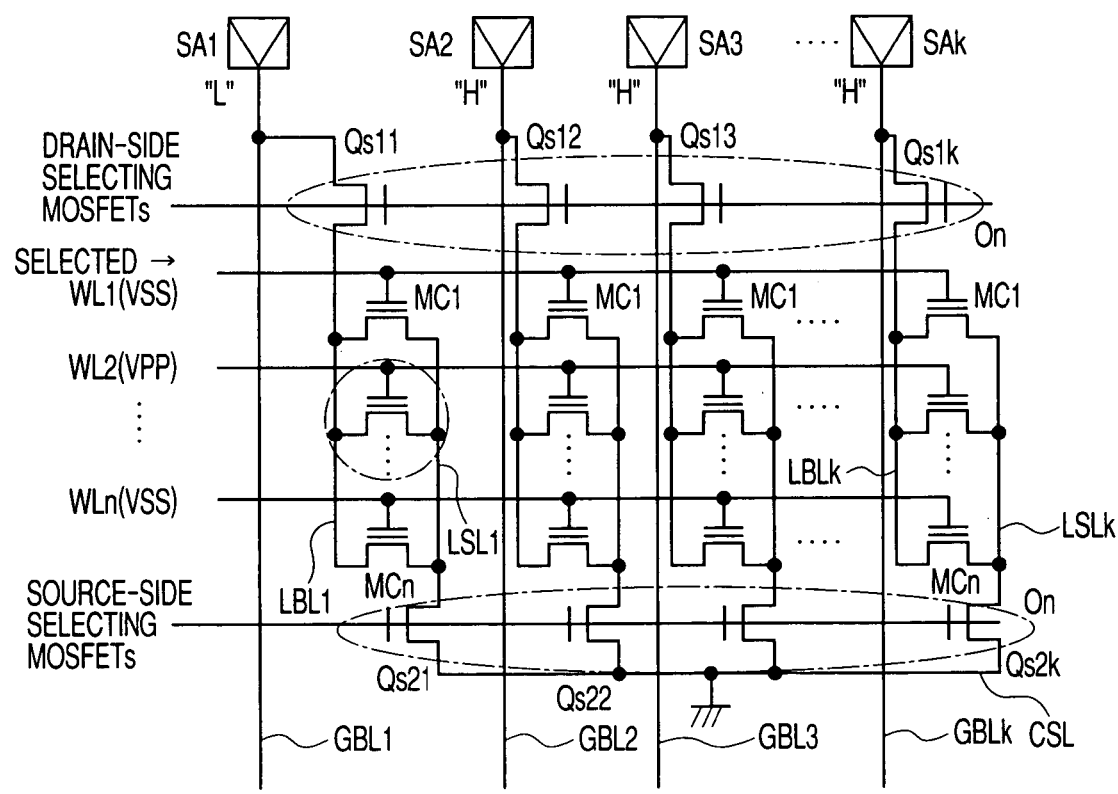
FIG. 8 is a schematic circuit diagram used to explain the recovery of depletion failure of the flash memory of this embodiment.

In addition, this embodiment is designed to perform, on finding a word line on which a memory cell in depletion failure exists as explained above, the recovery of depletion failure based on the writing of read-out data held in the sense amplifiers SA1 to SAk so that the threshold voltage of the failing cell is raised. FIG. 8 shows the recovered state of depletion failure.

Specifically, as shown in FIG. 8, all drain-side and source-side selecting MOSFETs Qs11 to Qs1$k$ and Qs21 to Qs2$k$ within the string in which the failing cell is found are brought to the unselection level (0 V), and the local bit lines LBL1 to LBLk are driven through the global bit lines GBL1 to GBLk by the sense amplifiers SA1 to SAk which held read-out data.

Consequently, a low-level (0 V) writing voltage is applied to the bit line (LBL1) on which the failing cell exists, with other bit lines having application of a high-level (e.g., 5 V) write-blocking voltage. As a result, only the failing cell has injection of negative charges on its floating gate, causing the threshold voltage to rise, and it is recovered from depletion failure. The duration or the number of times of application of writing voltage VPP in the depletion failure recovery operation is set to be shorter or smaller than that of application of writing voltage VPP in the normal write operation.

Next, another embodiment of the second stage operation for pinpointing a memory cell in depletion failure will be explained with reference to FIG. 9 and FIG. 10. The first stage for surveying a string for finding the emergence of depletion failure takes place in the same manner as the first embodiment.

In the second stage of this embodiment, all drain-side and source-side selecting MOSFETs Qs11 to Qs1$k$ and Qs21 to Qs2$k$ within the selected string are turned on and each word line WL1 to WLN is pulled to the selection level VMW in turn so that the local bit lines LBL1 to LBLk within the selected string are precharged to the high level (e.g., 3.3 V) by the sense amplifiers SA1 to SAk through the global bit lines.

The word line selection level VMW for depletion failure detection based on this embodiment is not the selection level of the usual reading operation, but it is set to a negative voltage, e.g., −6 V, which is lower than the threshold voltage of a failing cell. Unselected word lines can have their level pulled to the unselection level VSS (0 V) of the usual reading operation.

Figure 9:
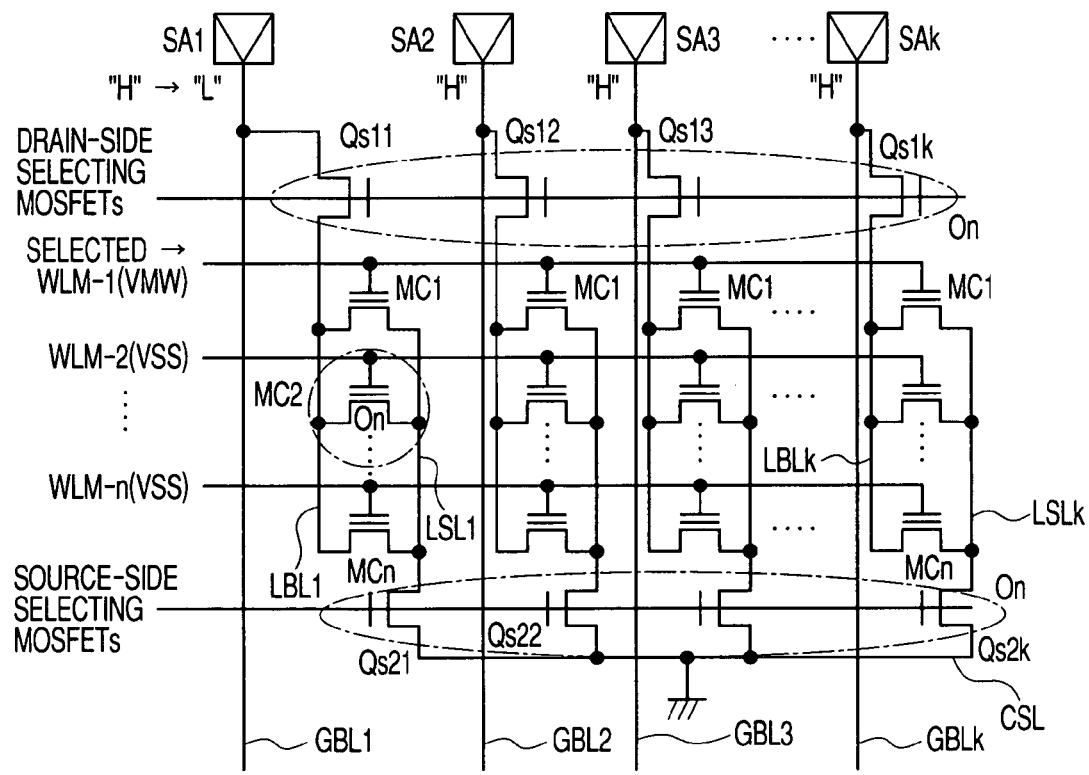
FIG. 9 is a schematic circuit diagram used to explain the second stage of depletion failure detection (at the selection of a word line without depletion failure) of a flash memory based on a second embodiment of this invention.
Figure 10:
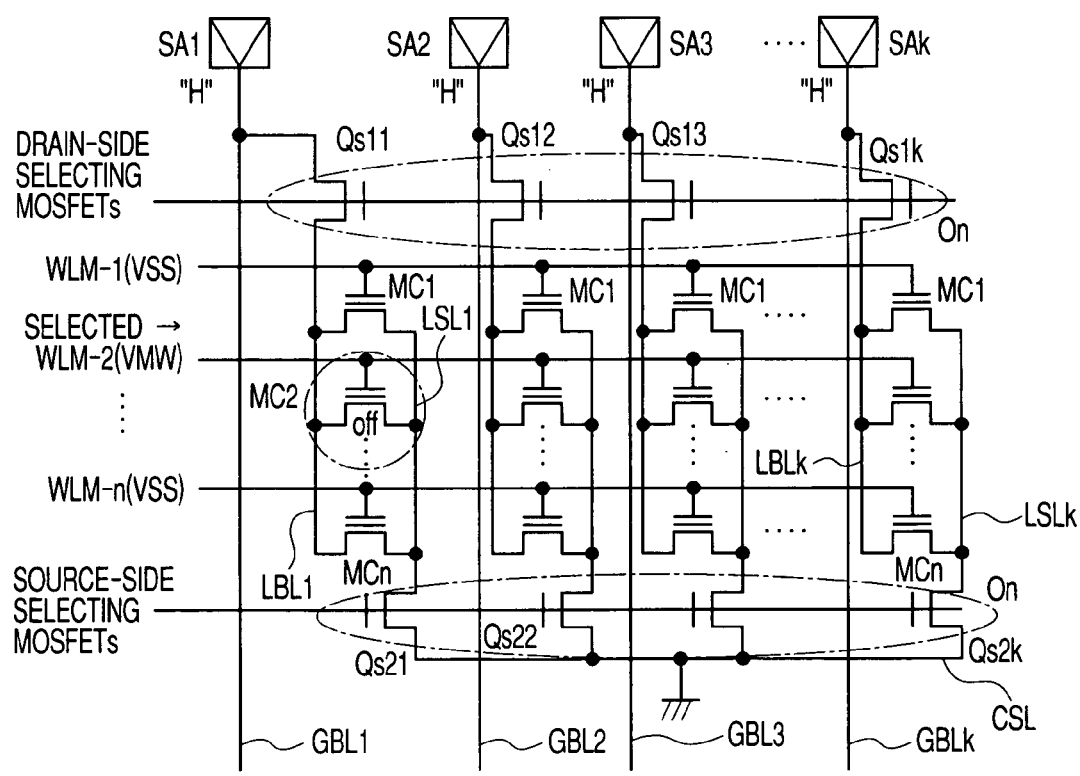
FIG. 10 is a schematic circuit diagram used to explain the second stage of depletion failure detection (at the selection of a word line with depletion failure) of the flash memory of this embodiment.

A memory cell in depletion failure has its threshold voltage brought to an on-state which is lower than the unselection level of word line, and therefore if there is no failing cell among the memory cells connected to the word line having application of the selection level VMW and there is a failing cell among the memory cells connected to the word lines having application of unselection level VSS, a current flows from the bit line to the source line through the failing cell, causing the bit line voltage to fall as shown in FIG. 9. Consequently, the sense amplifier connected to that bit line detects the low level (data "0"). FIG. 9 shows the depletion failure of memory cell MC2 which is connected to the local bit line LBL1 and the resulting low-level detection by the sense amplifier SA1.

Otherwise, if a memory cell in depletion failure exists among the memory cells connected to the word line having application of the selection level VMW, the memory cell which has been on at the unselection level becomes the off-state since the word line selection level VMW is lower than the threshold voltage of failing cell. Consequently, the voltage of any local bit line LBL1 to LBLk does not fall, causing all sense amplifiers SA1 to SAk to detect the high level (data "1").

The depletion failure detection (second stage) of the first embodiment explained in connection with FIG. 6 and FIG. 7 has a drawback of increased power consumption due to the use of the voltage VSS (0 V) for a smaller number of selected word lines and the negative voltage VMW (−6 V) for a larger number of unselected word lines. In contrast, the second embodiment has an advantage of smaller power consumption based on the use of the negative voltage VMW (−6 V) for a smaller number of selected word lines and the voltage VSS (0 V) for a larger number of selected word lines.

Figure 15:
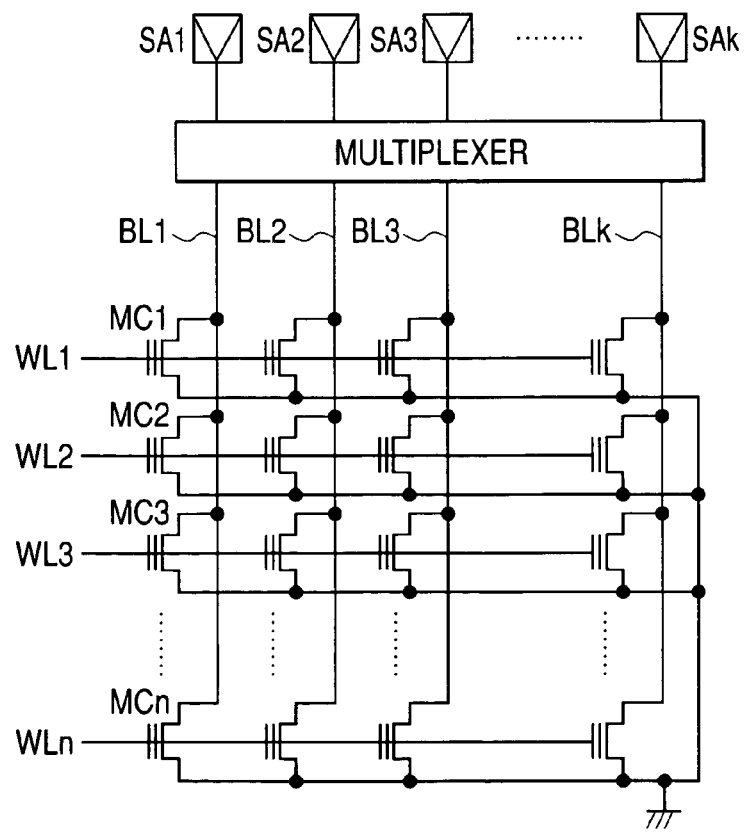
FIG. 15 is a schematic circuit diagram showing the configuration of a memory cell array of NOR-type flash memory based on a third embodiment of this invention.
Figure 16B:
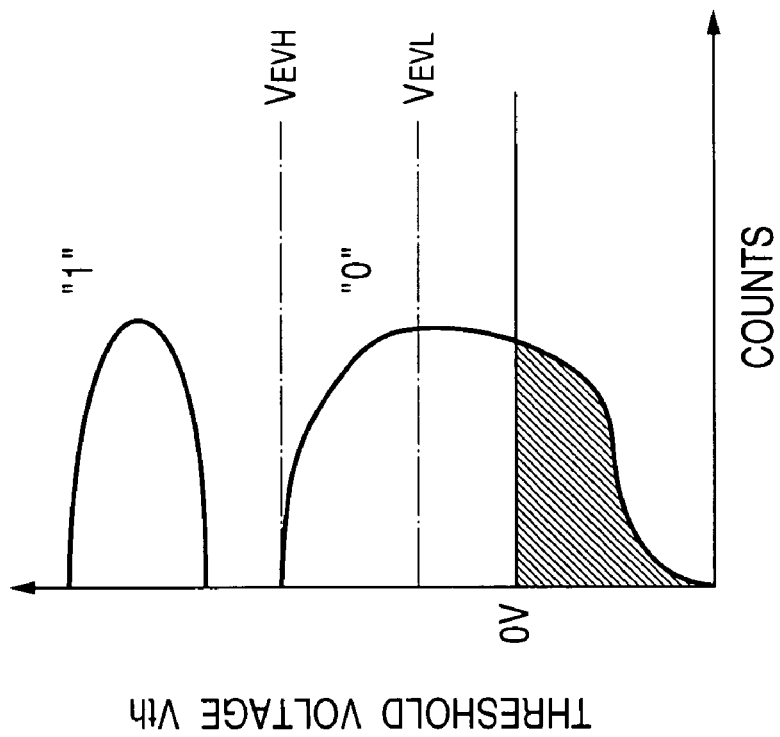
FIGS. 16A and 16B are histograms of threshold voltage of memory cells of the flash memories of the embodiments, showing the case of a normal memory cell array and the case of a memory cell array including memory cells in depletion state, respectively.
Figure 16A:
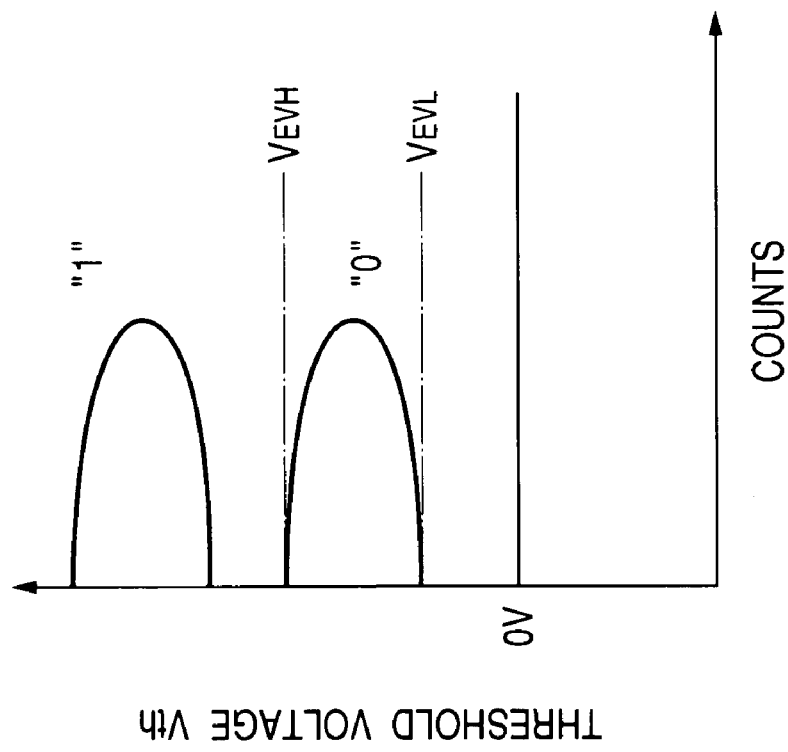
Figure 18A:
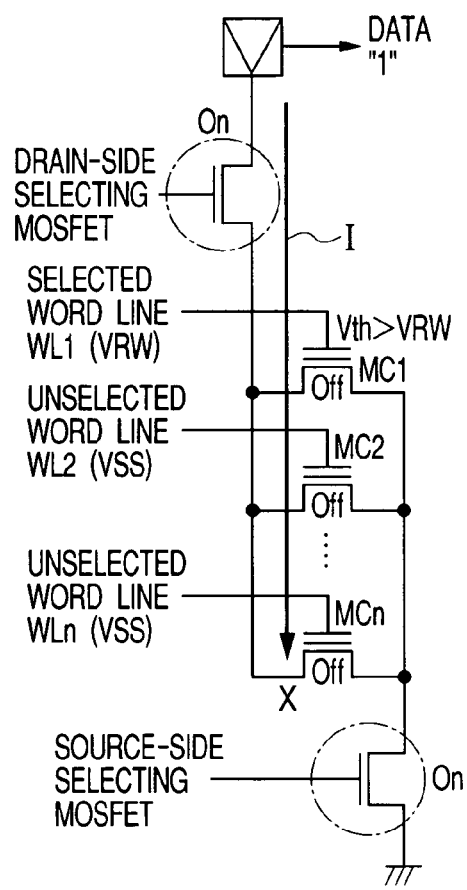
FIGS. 18A and 18B are schematic circuit diagrams of an AND-type flash memory, showing the state at data read-out from a memory cell column without depletion failure and the state at data read-out from a memory cell column with depletion failure, respectively.
Figure 18B:
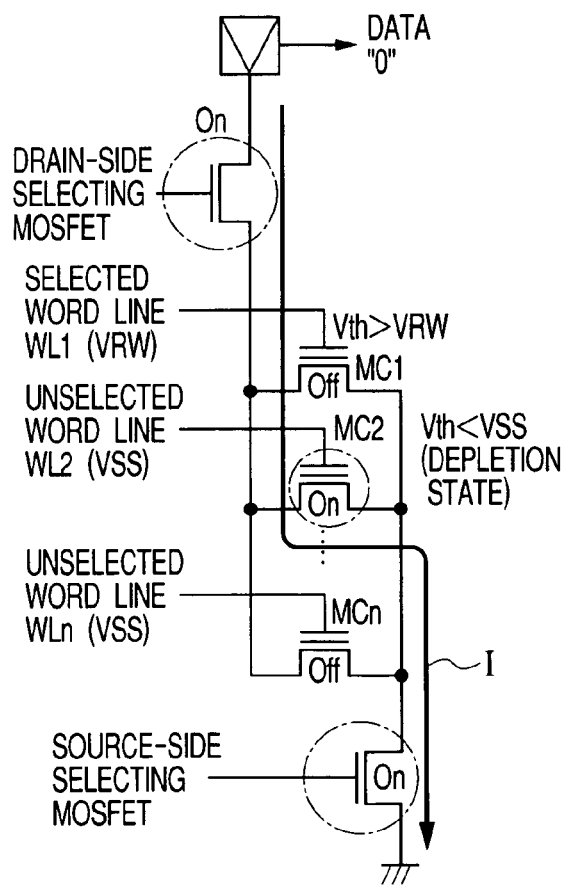

However, the second embodiment is not capable of pinpointing two more or memory cells in depletion failure on different word lines, and it is not capable of recovering the depletion failure by use of read-out data held in the sense amplifiers since all sense amplifiers become to have the same read-out data at the detection of depletion failure. Therefore, this embodiment is not much effective for such nonvolatile memories that erase memory cells by plural word lines (string). These nonvolatile memories include a so-called NOR-type flash memory as shown in FIG. 15 for example.

Some AND-type flash memories erase memory cells of one word line at a time, in which case only memory cells on one word line can develop depletion failure at a power supply cutoff during the erasing operation, and two or more memory cells on different word lines scarcely fail simultaneously. The recovery of depletion failure can be performed by writing or erasing all memory cells on the word line on which failing cells exist, instead of using read-out data of the sense amplifiers, and therefore this embodiment is still very effective for some cases.

It should be noted that when the writing operation for the recovery of depletion failure is implemented through the execution of a write sequence which is initiated by the usual write command, the memory cell threshold voltage can possibly be raised excessively. On this account, it is desirable to run a sub-sequence of the write-back operation which is included in the erasure sequence. Although the execution of erasure command for the recovery of depletion failure seems to be discordant, the abovementioned sub-sequence of write-back operation included in the erasure sequence can be used for the recovery of depletion failure.

Moreover, in the case of a power supply cutoff at an early phase of erasure operation, there can emerge memory cells which are not below the upper-limit of erasure distribution, besides memory cells in depletion failure. For example, if there are memory cells which store data "1" (high threshold voltage) and memory cells which store data "0" (low threshold voltage) among the memory cells to be erased based on the one-time application of erasing pulse, the threshold voltage of the memory cells of "1" does not fall below the upper-limit value VEVH of erasure distribution, while the threshold voltage of the memory cells of "0" falls below 0 V, and the occurrence of a power supply cutoff under the threshold voltage distribution as shown in FIG. 17A is highly conceivable.

Accordingly, by executing the erasure command on detecting the depletion failure in this situation, it is possible to make the threshold voltage of failing cells above the lower-limit value VEVL of erasure distribution and make the threshold voltage of memory cells, which is above the upper-limit value VEVH of erasure distribution, below the upper-limit value VEVH, as shown in FIG. 17B.

As an alternative scheme against the detection of depletion failure for each word line and recovery of depletion failure and the following address increment and detection of depletion failure for the next word line, the detection of depletion failure for the string is implemented and the address is incremented in the case of detection of depletion failure. The basis is that in the case of a relatively large number of word lines in a string, depletion failure detection always for all word lines takes a long time, and depletion failure occurs conceivably on one word line in a nonvolatile memory, such as an AND-type memory cell array, which erases data of a word line at a time.

Figure 3:
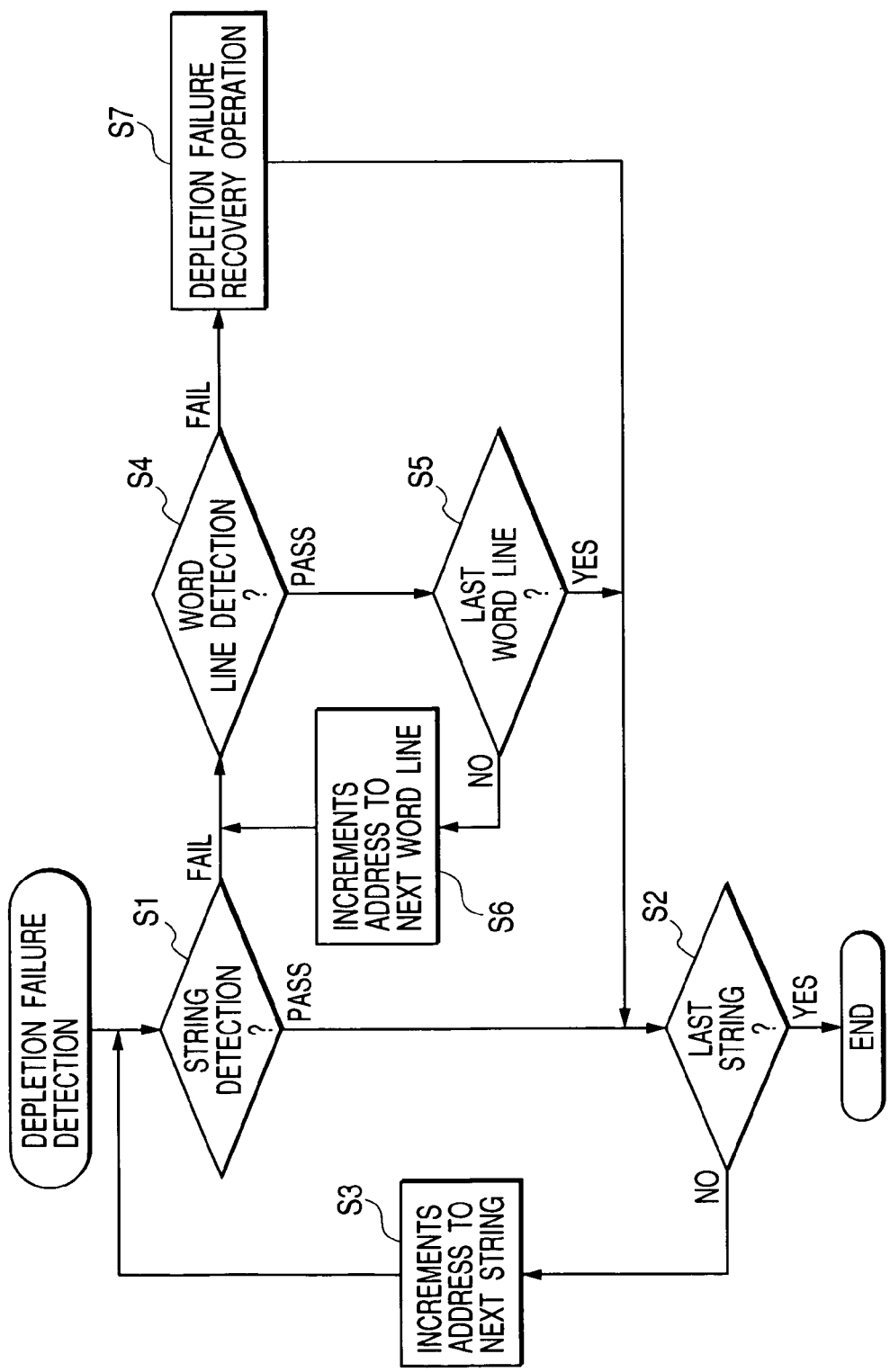
FIG. 3 is a flowchart showing the depletion failure detection and recovery operations of the flash memory of this embodiment.

Moreover, in the case of string-wise data erasure, such as the case of a NOR-type memory cell array, by erasing a string of data at the detection of depletion failure at step S1 in FIG. 3, it is possible to contain the memory cell threshold voltage within the erasure distribution without implementing the depletion failure detection for each word line even in the case where there are memory cells having higher threshold voltages in the string or there are memory cells in depletion failure on plural word lines, thereby to complete the recovery operation in a short time.

Next, a third embodiment of this invention will be explained. This embodiment is a memory card incorporating a flash memory and controller, as shown in FIG. 11 for example, which operate in unison to recover memory cells from depletion failure.

Figure 11:
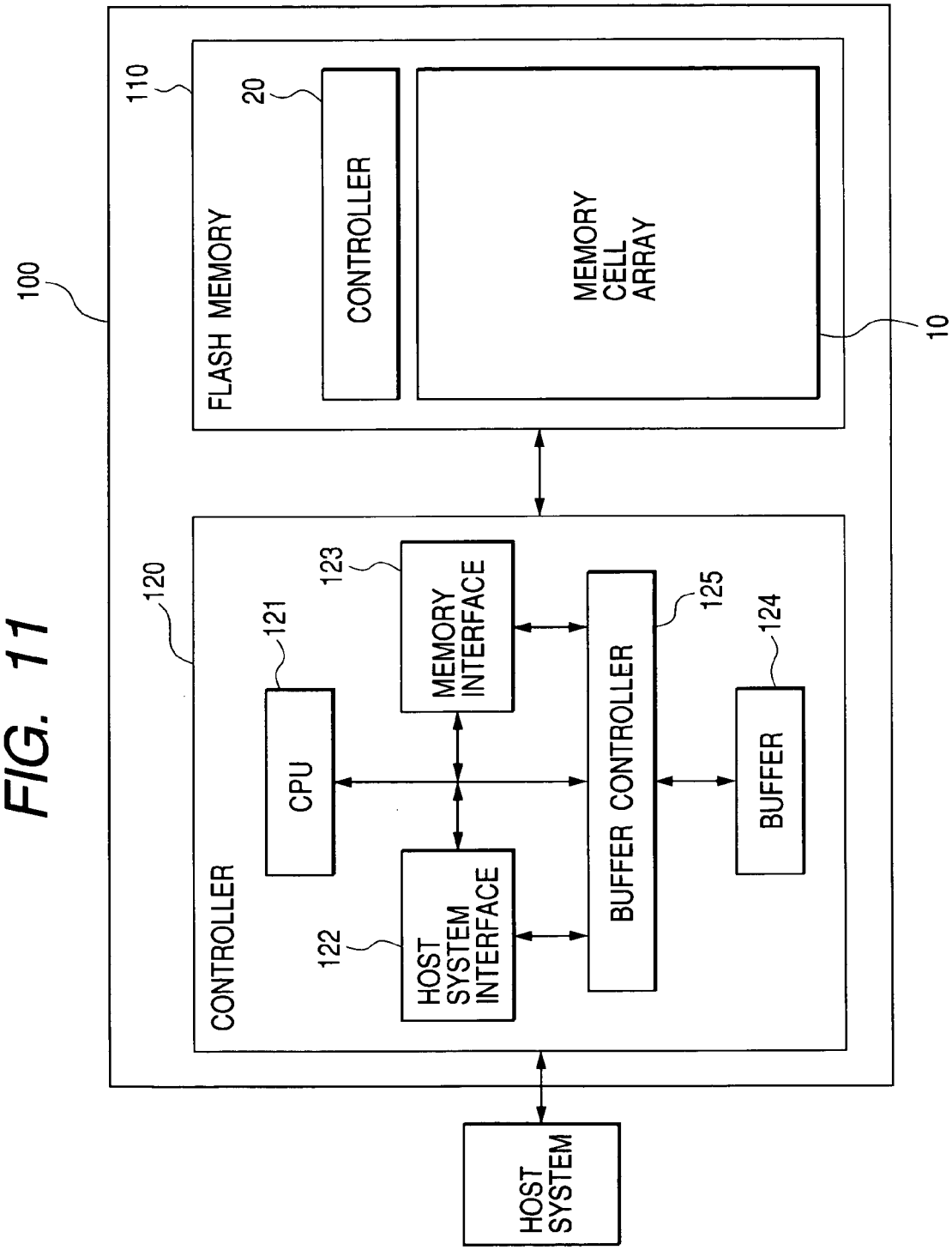
FIG. 11 is a block diagram showing the arrangement of a memory card which incorporates the inventive flash memory.

The configuration of a memory card 100 in FIG. 11 is to be briefly described.

In FIG. 11, the memory card 100 includes a flash memory 110 which is adapted to erase electrically a certain number of bits of data at once as explained in the preceding embodiments, and a controller 120 which controls the data writing and reading of the flash memory 110 in accordance with external commands. The flash memory 110 and controller 120 are formed as semiconductor integrated circuits on separate semiconductor chips which are mounted on a circuit board, and the whole circuit board is coated with resin or encased in a ceramic package to have a profile of card.

The memory card has on its one edge an alignment of external terminals 130 which are connected electrically to the circuit of a host system so that the card is supplied with power from the system and transacts signals with the system when the memory card 100 is put in the card slot of the system. These external terminals 130 are connected to terminal pads of the controller 120 through printed wires formed on the circuit board or through bonding wires. The flash memory 110 and controller 120 are connected to each other through printed wires, or alternatively one of the flash memory 110 and controller 120 is mounted on the other and connected to each other through bonding wires.

The controller 120 includes a microprocessor (MPU) 121 which controls the whole memory card inclusive of data transfer, a host system interface circuit 122 which implements the signal transaction with the host system, a memory interface circuit 123 which implements the signal transaction with the flash memory 110, a buffer memory 124 of RAM (random access memory) which holds temporarily write-in data and command codes put in from the host system and read-out data from the flash memory 110, and a buffer controller 125 which controls the data writing and reading of the buffer memory 124. The buffer controller 125 may include an error correction circuit which generates error correction codes for write-in data to the flash memory 110, checks read-out data based on the error correction codes, and corrects data errors.

The flash memory 110 of this embodiment is provided with only the depletion failure detection function out of the depletion failure detection/recovery functions of the first embodiment. The depletion failure detection function is divided into a string survey function and a word line survey function, and each function deals with a string or word line specified in response to an input command and address. Recovery from depletion failure can be implemented by use of the existing commands such as the writing command or erasure command. Accordingly, in this embodiment, the controller 120 needs to generate commands and addresses, and also data for recovery when necessary, and delivers to the flash memory 110.

The control circuit 20 of the flash memory 110 has a status register which indicates the result of survey by the failure detection function on expiration of a certain time following the command issuance by the controller 120. An alternative scheme against the provision of status register is to release signals indicative of the survey result from external terminals.

Furthermore, this embodiment can be designed to find the emergence of depletion failure by the controller based on the read-out data of sense amplifiers, instead of the use of status register of survey result. In this case, the flash memory does not need the read-out data discrimination circuit, and it is enough to add a function of setting control signals derived from the address (e.g., signals for pulling all word lines to the unselection level and turning on the drain-side and source-side selecting MOSFETs) and a voltage level in response to the command.

The depletion failure detection/recovery operations of this embodiment can be performed in the same manner as shown by the flowchart of FIG. 3. The only difference from the preceding embodiments is that this operation is done by the external controller 120 instead of the internal control circuit 20 of the flash memory.

Although, in this embodiment, the flash memory 110 and controller 120 shown in FIG. 11 are formed as separate semiconductor integrated circuits, these parts can be formed as one semiconductor integrated circuit on one semiconductor chip. A resulting semiconductor integrated circuit is capable of performing the depletion failure detection and recovery automatically.

Next, variant embodiments of this invention will be explained.

In contrast to the previous embodiment in which the controller 120 issues a certain command to the flash memory 110 to carry out the depletion failure detection/recovery operations, a first variant embodiment is designed such that the flash memory by itself runs depletion failure detection/recovery programs by reading them out of the program ROM following the ordinary power-on operations (step S21) including the reference voltage establishment of the internal power circuit 40 and the reading of the state of voltage trimming fuse.

This scheme reduces the task of the controller 120. Namely, the flash memory performs the depletion failure detection and recovery automatically without relying on the command issuance by the controller. As a modified design, the flash memory is provided therein with a circuit for sensing a power supply cutoff during the erasing operation and a flag register (1-bit nonvolatile memory) for holding the sensing result, and it checks the flag register at the time of power-on and, only when a power cutoff is indicated, reads out and runs the depletion failure detection/recovery programs.

In a system which stores an address conversion table in the flash memory, it often runs a program for reading table data into an external SRAM in the power-on operation of step S11. It is desirable for this kind of system to divide the power-on operation into two parts, thereby implementing the reference voltage establishment and voltage trimming fuse reading prior to the depletion failure detection/recovery operations and implementing the table data reading after the operations.

A second variant embodiment is a flash memory based on the multi-bank scheme in which plural memory cell arrays (banks) are included with the intention of increased storage capacity and speed. A multi-bank flash memory has its banks BANK0 to BANKn provided with individual buffer memories BFM0 to BFMn formed of SRAM or the like as shown in FIG. 13 for example so that the banks can write data concurrently.

Figure 14:
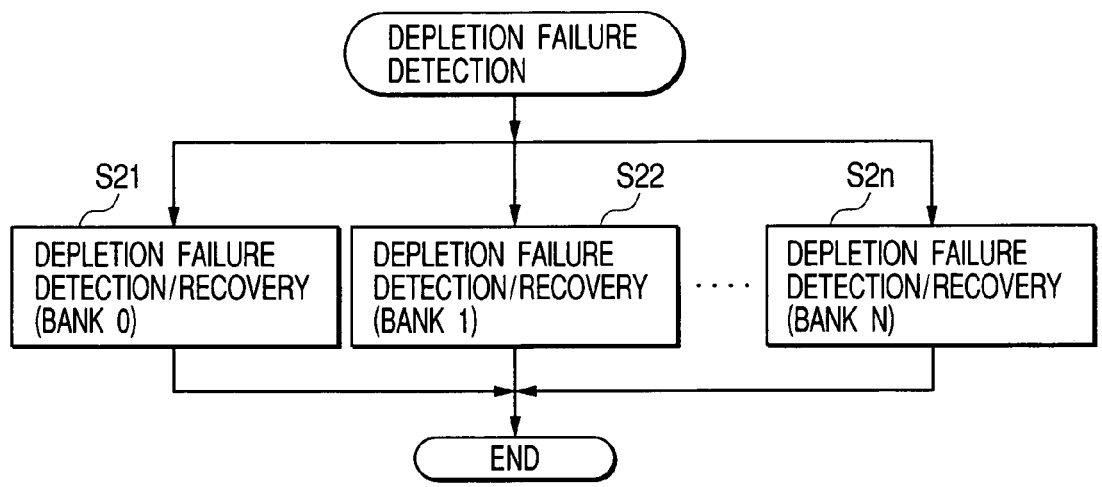
FIG. 14 is a flowchart showing the operations of the flash memory of the second variant embodiment.

The multi-bank flash memory of this embodiment is designed to perform the depletion failure detection/recovery operations S20 to S2$n$ for the banks BANK0 to BANKn concurrently as shown in FIG. 14, instead of performing in turn from bank BANK0. Each of the depletion failure detection/recovery operations S20 to S2$n$ shown in FIG. 14 takes place as shown by the flowchart of FIG. 3.

In contrast to the AND-type flash memories of the preceding embodiments in which memory cells are connected in parallel between the local bit lines and the local source lines running in parallel to form columns of memory cells, this embodiment can be applied to a so-called NOR-type flash memory in which memory cells in a column have their drains connected to a respective bit line among BL1 to BLk and memory cells on a row have their sources connected to a respective source line among SL1 to SLk as shown in FIG. 15.

Specifically, in the NOR-type flash memory shown in FIG. 15, the sense amplifiers SA1 to SAk detect the voltage levels of the bit lines BL1 to BLk, with all word lines WL1 to WLn being pulled to the unselection state (VSS), thereby finding the presence of memory cells in depletion state in the memory cell array. Subsequently, the sense amplifiers SA1 to SAk detect the voltage levels of the bit lines BL1 to BLk, with each word line WL1 to WLn being pulled in turn to the selection voltage (VSS) and remaining word lines being pulled to the negative unselection voltage VMW, thereby pinpointing a memory cell in depletion state. Based on the immediate read-out data of the sense amplifiers SA1 to SAk, the threshold voltages of memory cells in depletion failure can be corrected.

While the present invention has been described in connection with the specific embodiments, the invention is not confined to these embodiments and various alterations are obviously possible without departing from the essence of the invention. For example, although the foregoing embodiments are flash memories, with each memory element (memory cell) storing 1-bit data, the present invention is also applicable to flash memories which store two or more bits of data in each memory cell.

Although, in the foregoing embodiments, a memory cell is erased by having a low threshold voltage and written by having a high threshold voltage, the present invention is also applicable to flash memories in which a memory cell is erased by having a high threshold voltage and written by having a low threshold voltage. In this case, the depletion failure which has occurred at a power supply cutoff during the write operation can be detected and recovered effectively based on the inventive scheme.

Although the foregoing embodiments are nonvolatile memories formed of MOSFETs, with each memory cell of array having a floating gate and a control gate, the present invention is also applicable to nonvolatile memories having memory cells having the MONOS structure. Although, in the foregoing embodiments, the first-stage operation for finding the emergence of depletion failure is implemented for each string at a time, an alternative scheme is to search for depletion failure over the memory cell array and implement the second-stage operation for pinpointing a failing cell on finding the emergence of depletion failure in the array.

Although the foregoing embodiments are flash memories, which are in the field of the present invention, the present invention is not confined to this category of memory, and the invention can be applied extensively to semiconductor memories having nonvolatile memory elements which store data in terms of the shift of threshold voltage in response to voltage application.

Among the affairs of the present invention disclosed in this specification, the major effectiveness is briefed as follows.

According to the present invention, an electrically writable/erasable nonvolatile semiconductor memory such as an AND-type or NOR-type flash memory having the array structure, in which numerous memory cells are connected in parallel between common bit lines and source lines, is capable of readily detecting a memory cell in depletion failure which occurs in the event of a power supply cutoff during the memory cell threshold voltage shift-down operation by the data writing or erasing operation.

The inventive nonvolatile semiconductor memory is capable of pinpointing a memory cell in depletion failure and recovering the memory cell from the depletion state swiftly. The depletion failure detection/recovery functions for memory cells can be accomplished without the need of significant increase in circuit scale.

What is claimed is:

1. A nonvolatile semiconductor memory comprising a memory array which includes a plurality of nonvolatile memory elements which store data in terms of threshold voltage levels, said memory being adapted to implement:
   a first operation of applying a first voltage which corresponds to an unselection state at data reading, to plural word lines in said memory array and detecting a current flow through any of the memory elements on the word lines, thereby finding the presence of a failing element in said memory array; and
   a second operation, which is implemented upon finding the presence of a failing memory element by said first operation, of applying said first voltage to one of said plural word lines, while applying a second voltage, which is lower than said first voltage, to remaining word lines and detecting a current flow through any nonvolatile memory element, thereby pinpointing a failing memory element having a threshold voltage lower than a prescribed voltage level.

2. A nonvolatile semiconductor memory according to claim 1, wherein said first and second operations are initiated in response to entry of control signals and address signals from the outside, and a result of detection of said second operation is released to the outside.

3. A nonvolatile semiconductor memory comprising a memory array which includes a plurality of nonvolatile memory elements which store data in terms of threshold voltage levels, said memory being adapted to implement:
   a first operation of applying a first voltage which corresponds to an unselection state at data reading, to plural word lines in said memory array and detecting a current flow through any of the memory elements on the word lines, thereby finding the presence of a failing element in said memory array;
   a second operation, which is implemented upon finding the presence of a failing memory element by said first operation, of applying said first voltage to one of said plural word lines, while applying a second voltage, which is lower than said first voltage, to remaining word lines and detecting a current flow through a nonvolatile memory element coupled to any of said word lines, thereby pinpointing a failing memory element having a threshold voltage lower than a prescribed voltage level; and
   a third operation of raising the threshold voltage of said failing memory element having the lower threshold voltage on said one word line by use of data which is held in a read-out amplifier by said second operation.

4. A nonvolatile semiconductor memory according to claim 3, wherein said memory array comprises a plurality of first memory element sets each including a plurality of nonvolatile memory elements coupled in parallel to a first bit line or a first source line.

5. A nonvolatile semiconductor memory according to claim 4, wherein said memory array comprises a plurality of second memory element sets each including a plurality of said first memory element sets, said first operation being implemented for each of said second memory element sets at a time.

6. A nonvolatile semiconductor memory according to claim 5 including a plurality of said memory arrays, said first and second operations being implemented concurrently for said plural memory arrays.

7. A nonvolatile semiconductor memory according to claim 6, wherein said first operation is or said first, second and third operations are implemented at the time of power-on.

8. A nonvolatile semiconductor memory according to claim 6, wherein said nonvolatile memory elements have their threshold voltage shifted up by a writing operation and shifted down by an erasing operation, and
   wherein said first operation or said first, second and third operations are implemented at the time of power-on following a power supply cutoff during the erasing operation.

9. A storage device comprising:
   a nonvolatile semiconductor memory including a memory array which includes a plurality of nonvolatile memory elements which store data in terms of threshold voltage levels, said memory being adapted to implement:
   a first operation of applying a first voltage which corresponds to an unselection state at data reading, to plural word lines in said memory array and detecting a current flow through any of the memory elements on the word lines, thereby finding the presence of a failing element in said memory array; and
   a second operation of applying said first voltage to one of said word lines, while applying a second voltage, which is lower than said first voltage, to remaining word lines and detecting a current flow through any nonvolatile memory element, thereby pinpointing a failing memory element having a threshold voltage lower than a prescribed voltage level,
   and adapted to release results of finding and detection of said first and second operations to the outside; and
   a control circuit which is adapted to issue control signals and address signals for initiating said first and second operations to said nonvolatile semiconductor memory,
   said control circuit issuing a first control signal and a first address signal for initiating said first operation to said nonvolatile semiconductor memory, issuing to said nonvolatile semiconductor memory, depending on the result of finding of said first operation, a second control signal and a second address signal for initiating said second operation, and issuing to said nonvolatile semiconductor memory, depending on the result of detection of said second operation, a third control signal and a third address signal for initiating a third operation which raises the threshold voltage of the nonvolatile memory element having the lower threshold voltage than the prescribed voltage level detected by said second operation.

10. A storage device according to claim 9, wherein said memory array comprises a plurality of first memory element sets each including a plurality of nonvolatile memory elements coupled in parallel to a bit line or a source line.

* * * * *